United States Patent
Scheytt

(10) Patent No.: US 6,483,288 B1
(45) Date of Patent: Nov. 19, 2002

(54) ENGAGEMENT DETECTION CIRCUIT

(75) Inventor: Johann Christoph Scheytt, Reken (DE)

(73) Assignee: Rubitec-Gesellschaft für Innovation und Technologie der Ruhr Universität Bochum mbH, Bochum (DE)

( * ) Notice: Subject to any disclaimer, the term of this patent is extended or adjusted under 35 U.S.C. 154(b) by 0 days.

(21) Appl. No.: 09/704,316

(22) Filed: Nov. 2, 2000

(30) Foreign Application Priority Data

Nov. 2, 1999 (DE) .......................... 199 52 828
Oct. 30, 2000 (DE) .......................... 100 53 808

(51) Int. Cl.[7] .................... G01R 13/02; G01R 25/00
(52) U.S. Cl. ................... 324/76.62; 324/76.52; 324/76.78; 702/72
(58) Field of Search .................. 324/76.62, 76.53, 324/76.52, 76.77, 76.79, 76.68, 76.78, 76.48, 76.44; 331/25; 702/75, 78, 72; 327/244

(56) References Cited

U.S. PATENT DOCUMENTS

| | | | | |
|---|---|---|---|---|
| 3,836,758 A | * | 9/1974 | Schneider et al. ........... 702/75 |
| 4,345,206 A | * | 8/1982 | Skalka .................... 324/76.44 |
| 4,494,067 A | * | 1/1985 | Barszczewski ........... 324/76.48 |
| 4,953,095 A | * | 8/1990 | Ishikawa et al. ............. 702/78 |
| 5,905,410 A | | 5/1999 | Holmes et al. |
| 5,990,673 A | * | 11/1999 | Forsberg .................. 324/76.62 |
| 6,016,080 A | * | 1/2000 | Zuta et al. .................... 331/25 |

* cited by examiner

Primary Examiner—N. Le
Assistant Examiner—Anjan K. Deb
(74) Attorney, Agent, or Firm—Collard & Roe, P.C.

(57) ABSTRACT

An engagement detection circuit for a clock recovery circuit consisting of a phase detector (3), a counter element (6) and a flip-flop (8). By employing a low-pass element (12) and a trigger element (13) connected downstream, a preliminary and a final engagement of a phase control circuit can be detected with the engagement detection circuit. This provides a clock recovery circuit for controlling a phase control loop with a phase detector (20), a loop filter (21), a voltage-controlled oscillator (22) and a controllable frequency divider (23).

8 Claims, 2 Drawing Sheets

ENGAGEMENT DETECTION CIRCUIT

This invention relates to an engagement detection circuit for detecting and indicating the engagement condition of a phase control circuit, with a phase detector, a counter element and a flip-flop. In the invention, the phase detector is acted upon on the input side by a data signal and a clock pulse and controls on the output side the counter element, and whereby the flip-flop, connected to the output of the counter element, is set or reset depending on the counter reading.

Furthermore, the invention relates to a clock recovery circuit that operates with such an engagement detection circuit.

Data communication over long transmission distances is increasingly gaining importance. Especially in connection with long traffic distances, the glass fiber optic transmission technology is becoming more and more successful because of the very high data transmission rates realizable with fiber optic lines. In the field of data transmission via glass fiber optic lines, the quality of the signal deteriorates due to fiber damping, signal distortions and noise. The signal therefore has to be regenerated repeatedly. This is accomplished by means of optical amplifiers and special optoelectronic regenerators. While only the fiber damping can be compensated by means of optical amplification, the optoelectronic regenerators permit almost complete regeneration of the data signal. So-called clock recovery circuits are the central components of such regenerators. Such recovery circuits serve to extract a low-noise clock pulse from the distorted and high-noise data signal. The data signal is then scanned in the regenerator with the recovered clock pulse and almost complete regeneration is achieved in that way. The clock recovery circuit operates completely electronically, which is why electrooptical signal conversions are required with the optoelectronic regenerator on the input and output sides. The so-called PLL's, or phase-locked control loops are advantageously employed for the clock recovery. These control loops consist of a phase detector on the input side, a loop filter, and a voltage-controlled oscillator on the output side, with a feedback of the output of the oscillator to the input of the phase detector. The phase control loop extracts the clock pulse from the data signal by controlling the voltage-controlled oscillator so that it oscillates synchronously with the data signal. The phase detector supplies the loop filter with a control signal that corresponds with the phase difference between the data signal and the output signal. The signal is low-pass filtered in the loop filter and controls the frequency of the voltage-controlled oscillator. Furthermore, phase control loops are very well-suited for bit rate-flexible clock recovery, wherein the frequency is adjusted not only by mistuning the voltage-controlled oscillator, but also by means of a frequency division. Clock recovery circuits can be realized in this manner in a very simple way that can be employed for all commonly used bit rates. An engagement detection circuit is required in this connection for automatically detecting and selecting the bit rate. By means of such an engagement detection circuit, it is possible to realize a control circuit that controls the oscillator frequency and the frequency division ratio. A bit rate range is selected by means of the switchable frequency divider, whereas safe locking to the desired bit rate can take place by means of the phase control loop. Clock recovery circuits with a bit rate range comprising several decimal powers can be realized in that way.

An engagement detection circuit of the type specified above is described, for example in U.S. Pat. No. 5,905,410. This known circuit indicates the engagement or disengagement of a phase control loop. This known circuit uses the output signal of the phase detector that determines the phase difference between the clock pulse of the phase control loop and the data signal. By means of a suitable digital circuit, the output signal of the phase detector is used for resetting at a time, one of two separate counters. One of the two counters is responsible for the clock cycles that are in phase, and the other for the cycles that are out of phase. Both counters are synchronously incremented by means of the clock pulse. The counter for the clock cycles that are in phase, has a higher bit number than the counter for the cycles that are out of phase. The overflows of the two counters are connected to the setting and resetting inputs of a flip-flop; the condition of the latter indicates the engagement of the phase control loop. What is achieved is that any engagement is signalized only after a high number of in phase clock cycles, whereas just a few clock cycles that are out of phase are sufficient for indicating any disengagement. The drawback of this known engagement detection circuit is that an unsolvable conflict of objectives exists between the rapid detection of engagement and disengagement that is desirable on the one hand, and resists unavoidable signal errors such as noise that is required on the other hand. Using the known engagement detection circuit in clock recovery circuits has the drawback that the speed of the frequency search is limited by the time constant of the engagement detection.

The present invention provides an engagement detection circuit where the aforementioned drawbacks are avoided to the greatest possible extent, and whereby it is particularly possible to realize rapid, yet noise-proof engagement detection. It is therefore possible to realize clock recovery circuits with rapid frequency detuning where the speed of the frequency search is not limited by the time constant of the engagement detection.

This problem is solved with an engagement detection circuit of the type specified above, in that a low-pass element and a trigger element are connected downstream of the flip-flop.

With the circuit of the invention, two different engagement signals are generated. The flip-flop indicates an engagement with low time delay. This preliminary engagement signal, however, has at the same time, a high sensitivity to noise influences. The first engagement signal serves as input for a low-pass element, to which a trigger element is connected downstream according to the invention. If the preliminary engagement signal is applied over a time that is preset by the time constant of the low-pass element, the trigger element is activated, and indicates at its output, a final engagement of the phase control loop with comparatively high time delay versus the preliminary engagement signal, whereby the final engagement signal however, has only a low sensitivity to noise disturbances.

An important advantage of the invention is that a high frequency detuning speed and thus a rapid frequency acquisition by the clock recovery circuit are possible due to the short time constant of the preliminary engagement detection. With a clock recovery circuit, the final engagement indication can be used at the time for preventing disengagement, because of short-time signal disturbances and noise. With a clock recovery circuit, the engagement behavior and the frequency acquisition behavior become independent of one another in this way.

It is useful to employ as the phase detector, a quadrature phase detector in connection with the engagement detection circuit with the data signal and the quadrature clock pulse—the latter being shifted by 90°—being applied to the input of the quadrature phase detector. The phase detector then generates output signals that are dependent only on the sign of the phase difference between the data signal and the clock pulse. The output signals can be usefully employed for controlling an incrementer/decrementer. In the engagement detection circuit of the invention, the incrementer/decrementer is employed as the counter element. It is then advantageously possible to control the incrementer/decrementer via the phase detector so that the incrementing or the decrementing input is activated depending on the phase difference between the data signal and the clock pulse. An incrementing count, for example, can then always take place when a positive phase difference is present between the date signal and the clock pulse. A decrementing count takes place in the presence of a negative phase difference. If, in the presence of an adequate number of clock cycles, the phase difference has a positive sign, the incrementing/decrementing counter is incremented until the overflow threshold has been reached. The flip-flop connected to the overflow of the counter element is then activated and, according to the invention, indicates the preliminary engagement. It is useful in this connection if the incrementing or decrementing count takes place with different incrementation, whereby the decrement is greater than the increment because phase differences with positive and negative signs will then occur with about the same frequency in the disengaged condition. Due to the fact that the decrement is greater than the increment, the counter element of the invention is safely decremented up to a minimum value. The flip-flop is usefully controlled so that it is reset when a defined counter reading is not reached, so that the output of the flip-flop indicates complete disengagement. Tests have shown that the engagement detection circuit of the invention operates in a particularly reliable way if the ratio of the decrement to the increment has a value of smaller than or equal to 3:1.

The flip-flop is advantageously controlled by the output of the counter element via an interconnected logic element. The individual bits of the counter element can then be linked so that any desired threshold value can be preset for resetting the flip-flop when the threshold value is not reached.

The low-pass element connected of the invention, downstream of the flip-flop, may be a conventional, analog operating low-pass filter. A common Schmitt trigger can be employed as the trigger element. As an alternative, it is advantageously possible to replace these elements by components that completely operate digitally. It is advantageous to use a counter element as the low-pass element, and to employ as the trigger element, a logic element and flip-flop combination. The digital solution offers the advantage that the time constant of the low-pass element can be adapted to the frequency if, for example, the additional counter element is incremented via the clock pulse.

With the engagement detection circuit as defined by the invention, it is possible to realize a particularly efficient clock recovery circuit. This clock recovery circuit has a phase control loop with a phase detector, a loop filter, a voltage-controlled oscillator, and a controllable frequency divider, whereby the voltage controlled oscillator and the frequency divider are controlled by means of a control circuit, depending upon the output signals of the engagement detection circuit. The engagement detection circuit as defined by the invention is combined in this connection with a conventional phase control circuit whose frequency can be tuned through continuously, and with a special control circuit. The control circuit controls the frequency detuning of the voltage-controlled oscillator and at the same time the frequency division ratio of the switchable frequency divider, in dependence of the preliminary and the final engagement detection. The oscillator may be detuned from its minimum up to its maximum oscillation frequency, which can be accomplished, for example by controlling the voltage of the loop filter. The various frequency bands are selected with the switchable divider.

With the clock recovery circuit as defined by the invention, it is useful if the bandwidth of the loop filter is controlled by means of the control circuit as well. A wide-banded filter characteristic of the loop filter is required for a rapid frequency search. For the final, exact engagement, it is then possible to reverse to a narrow-band characteristic.

Other objects and features of the present invention will become apparent from the following detailed description considered in connection with the accompanying drawing, which discloses two embodiments of the present invention. It should be understood, however, that the drawing is designed for the purpose of illustration only and not as a definition of the limits of the invention.

In the drawing, wherein similar reference characters denote similar elements throughout the several views.

Figure 1:
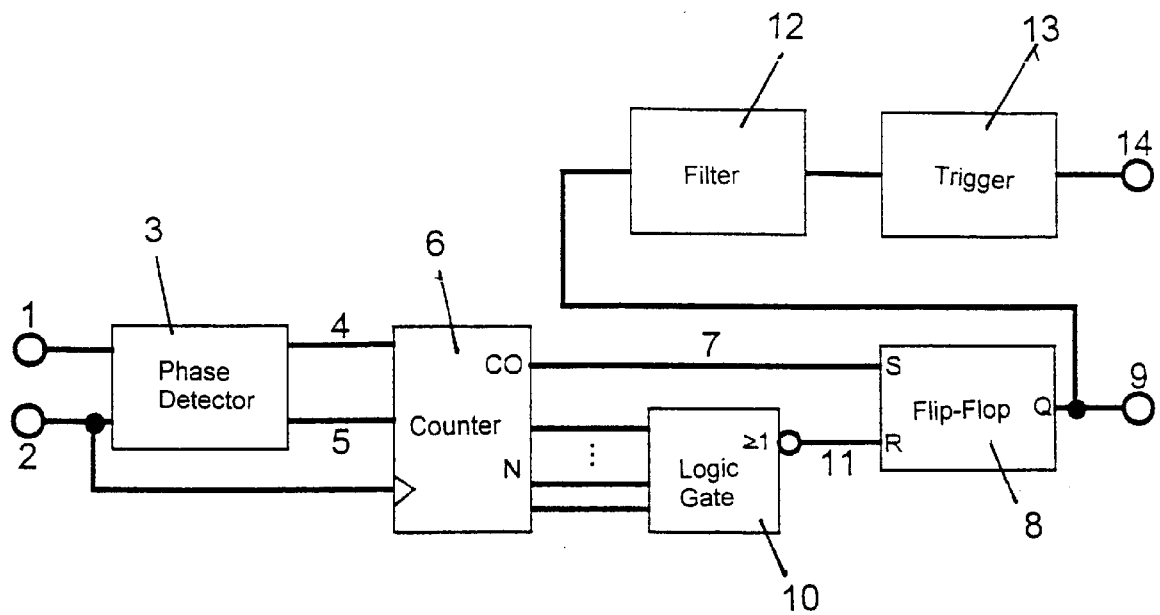
FIG. 1 shows a block circuit diagram of the engagement detection circuit as defined by the invention.

Referring to FIG. 1, the inputs of the engagement detection circuit are a data signal 1, and a quadrature clock pulse 2. The quadrature clock pulse is phase-shifted by 90° versus a clock pulse to be reconstructed. To detect the engagement of a phase control loop, the input signals 1 and 2 are supplied to a phase detector such as a quadrature phase detector 3. The latter generates an output signal 4 or 5 depending on the sign of the phase difference between the data signal and the quadrature clock pulse 2. Quadrature clock pulse 2 serves at the same time for incrementing or decrementing a counter element such as an incrementer/decrementer counter 6 depending on the output signal of quadrature phase detector 3. In the presence of a negative phase difference (signal 5), counter 6 is decremented in this connection by 3, whereas in the presence of a positive phase difference (signal 4) it is incremented by 1. Thus the ration of decrement to increment is smaller than or equal to 3:1. With an adequate number of clock cycles with a positive phase difference, a signal 7 is activated that indicates the overflow of the incrementer/decrementer counter 6. A flip-flop 8 is set by signal 7. The output 9 of said flip-flop indicates preliminary engagement. The individual bits of counter 6 are linked to each other by a logic gate 10, so that a signal 11 is activated when falling short of a threshold value that can be preset. Flip-flop 8 is reset by a signal 11. In that case, output 9 indicates the disengagement the engagement detection circuit. Output 9 of flip-flop 8 serves at the same time as input for a low-pass filter 12, with a Schmitt trigger 13 being connected downstream of the latter. If a preliminary engagement is indicated on output 9 over an adequate time that is preset by the time constant of low-pass filter 12, the output voltage of the low-pass filter 12 exceeds a defined threshold value, which leads to activation of an output 14 of Schmitt trigger 13. According to the invention, a final engagement of the engagement detection circuit is indicated on output 14. Signal 14 is insensitive to short-time variations of signal 9 because of low-pass filter 12. Therefore, if the circuit disengages for a short time because of noise or other signal errors, this brief disengagement will have no influence on the final engagement indication 14.

Figure 2:
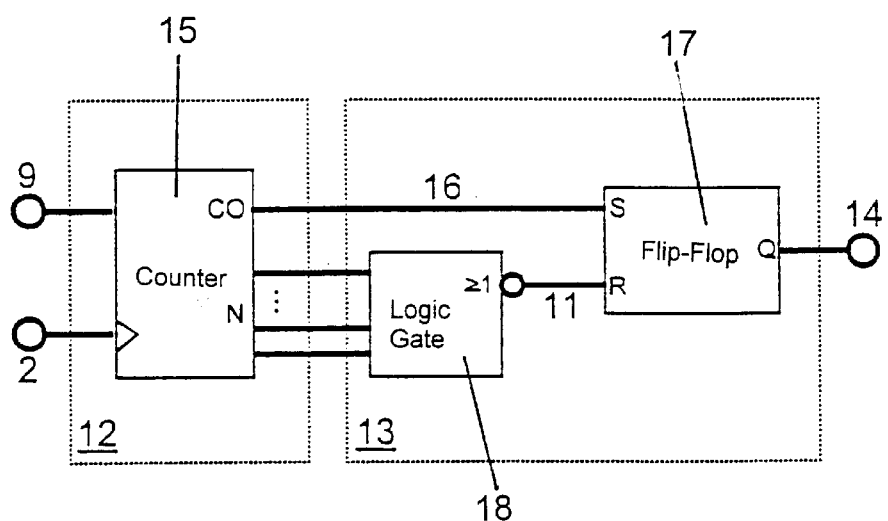
FIG. 2 shows the low-pass element and the trigger element of the digital design.

FIG. 2 shows another embodiment wherein low-pass element 12 and trigger element 13 of FIG. 1 are digital operating components. A counter element 15 serves this purpose. This counter element is incremented or decremented via the quadrature clock pulse 1 depending on the level of the preliminary engagement signal 9. If the preliminary engagement signal 9 is applied over an adequately long time, this will cause an overflow of counter element 15, which is indicated by a signal 16. This sets another flip-flop 17 at whose output the final engagement is indicated by means of signal 14. Reversely, disengagement over a longer period of time, which is indicated by signal 9, is due to the fact that the counter 15 falls short of a defined counter reading that can be preset by another logic gate 18, which then resets flip-flop 17. The time constant of the low-pass element is determined in this connection by the bit number of the counter 125. The time constant advantageously adapts itself to the clock pulse frequency because counter 15 is controlled by the clock pulse, as mentioned before.

Figure 3:
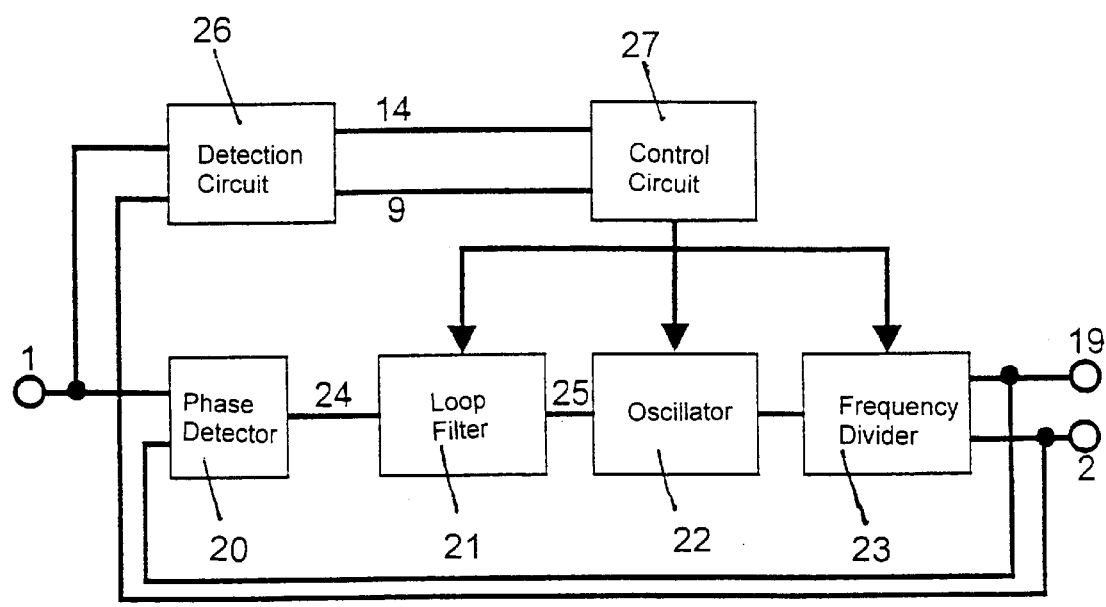
FIG. 3 shows the clock recovery circuit with the engagement detection circuit as defined by the invention.

The clock recovery circuit shown in FIG. 3 receives data signal 1 as the input. The function of the clock recovery circuit is to obtain from this signal, a clock pulse 19 which, with respect to frequency and phase, corresponds with the clock pulse on which data signal 1 is based. An important component of the clock recovery circuit is a phase control loop that comprises a phase detector 20, a controllable loop filter 21, a voltage-controlled oscillator 22, and a controllable frequency divider 23. Clock pulse 19 and quadrature signal 2, the latter being phase-shifted versus said clock pulse 19 by 90°, are the outputs of the frequency diver 23. Clock pulse 19 is fed back to the input of phase detector 20. Thus the phase detector 20 determines the phase difference between data signal 1 and clock pulse 19, whereby a signal 24 that is proportional to the phase difference is supplied to the loop filter 21. Loop filter 21 has a low-pass characteristic and controls oscillator 22 via an output signal 25. Once the phase control loop is correctly adjusted, a voltage is applied to output 25 of loop filter 21 that corresponds with the frequency of the cock pulse on which data signal 1 is based. Data signal 1 and quadrature clock pulse 2 are simultaneously supplied to an engagement detection circuit 26 as defined by the invention. As described above, the circuit generates a preliminary engagement signal 9 as well as a final engagement signal 14. The two signals are employed as input for a control circuit 27 through which voltage-controlled oscillator 22, controllable frequency diver 23 and loop filter 21 are controlled.

The following describes in a simplified manner how the frequency acquisition process takes places with the clock recovery circuit:

In the output condition, the preliminary and the final engagement signals 9 and 14, respectively, are deactivated. Control circuit 27 therefore detunes the frequency of voltage-controlled oscillator 22. When the maximal or minimal frequencies of oscillator 22 are reached, frequency divider 23 is reversed to another division ratio. While the detuning process takes place, phase detector 20 is first, still deactivated. Once the frequency of clock pulse 2 is near the bit rate of data signal 1, preliminary engagement signal 9 is activated by means of the engagement detection circuit 26, with the result that control circuit 27 is prompted to interrupt the detuning process.

The phase control loop can now automatically engage on data signal 1. As long as final engagement signal 14 is still deactivated, loop filter 21 operates wide-banded in order to permit engagement of the phase control loop as rapidly as possible. If the preliminary engagement signal 9 remains permanently deactivated, setting to the final engagement signal 14 takes place. This causes the control circuit of loop filter 21 to reverse to a narrow-banded characteristic, which is favorable for the clock recovery by means of the phase control loop. If the data signal is highly disturbed by noise, this may lead to short-time deactivation of the preliminary engagement signal 9 in spite of the fact that the phase control loop is engaged. The final engagement signal 14 is not affected by such short-time failures, so that the clock recovery circuit remains engaged. A new frequency search process is initiated by the control circuit 27 only if the final engagement signal 14 is deactivated as well.

Accordingly, while a few embodiments of the present invention have been shown and described, it is to be understood that many changes and modifications may be made thereunto without departing from the spirit and scope of the invention as defined in the appended claims.

What is claimed is:

1. An engagement detection circuit for detecting and indicating the engagement condition of a phase control circuit in response to a data signal and a clock pulse comprising:

a phase detector;

a counter element having its input coupled to said detector and comprising an incrementer/decrementer, wherein said incrementer/decrementer is controlled by said phase detector so that its incrementing input or decrementing input is activated depending on a phase difference between the data signal and the clock pulse, and wherein incrementing and decrementing counts take place with different incrementations, wherein the decrement is greater than the increment;

a flip-flop, coupled to the output of said counter element, so that when the clock pulse and the data signal are coupled to the input of said phase detector, its output controls said counter element, and wherein said flip-flop, connected to said counter element, is set or reset depending on the reading of said counter element;

a low-pass element connected to the output of said flip-flop; and a trigger element coupled to the output of said low-pass element for providing at its output a signal when the output of low-pass element exceeds a preset threshold value.

2. The engagement detection circuit according to claim 1, wherein said phase detector comprises a quadrature phase detector.

3. The engagement detection circuit according to claim 1, wherein the ratio of decrement to increment has a value smaller than or equal to 3:1.

4. The engagement detection circuit according to claim 1, further comprising a logic element, interconnected between said flip-flop and said counter, and wherein said flip-flop is controlled by the output of said counter element via said interconnected logic element.

5. The engagement detection circuit according to claim 1, wherein said low-pass element comprises a counter element, and wherein said trigger element comprises a combination of a logic element, and a flip-flop coupled to the output of said logic element.

6. A clock recovery circuit comprising:

an engagement detection circuit for detecting and indicating an engagement condition of a phase control circuit in response to a data signal and a clock pulse comprising;

a phase detector;

a counter element having its input coupled to said phase detector and comprising an incrementer/decrementer, wherein said incrementer/decrementer is controlled by said phase detector so that its incrementing input or decrementing input is activated depending on a phase difference between the data signal and the clock pulse, and wherein incrementing and decrementing counts take place with different incrementations, wherein the decrement is greater than the increment;

a flip-flop, coupled to the output of said counter element, so that when the clock pulse and the data signal are coupled to the input of said phase detector, its output controls said counter element and wherein said flip-flop, connected to said counter element, is set or reset depending on the reading of said counter element;

a low-pass element connected to the output of said flip-flop; and a trigger element coupled to the output of said low-pass element for providing at its output a signal when the output of low-pass element exceeds a preset threshold value;

a phase control loop with said phase detector connected to the data signal;

a loop filter, coupled to said phase detector;

a voltage-controlled oscillator, coupled to said loop filter;

a controllable frequency divider coupled to said oscillator; and a control circuit having its input coupled to said engagement detection circuit and its output coupled to said oscillator and said divider, whereby said voltage-controlled oscillator and said frequency divider are controlled by means of said control circuit depending on the output signals of said engagement detection circuit.

7. The clock recovery circuit according to claim 6, wherein the bandwidth of said loop filter is controlled by said control circuit.

8. A process for operating a clock recovery circuit which has a phase control loop, a phase detector, a loop filter, a voltage-controlled oscillator, a controllable frequency divider, an engagement detection circuit and a control circuit, wherein the frequency acquisition process proceeds based on a starting condition, in which a temporary and a final engagement signal of the engagement detection circuit are deactivated, according to the following steps:

detuning the frequency of the voltage-controlled oscillator with the control circuit;

switching a division ratio of the frequency divider by achieving the maximum or minimum frequency of the oscillator with the control circuit;

interrupting the detuning process with the control circuit as soon as the temporary engagement signal is activated;

switching the loop filter from a wide band to a narrow band characteristic as soon as the final engagement signal is activated; and switching back the loop filter to the wide band characteristic and initiating a new frequency acquisition process by detuning, as soon as the final engagement signal is deactivated.

* * * * *